(12) United States Patent
Weimer et al.

(10) Patent No.: US 12,484,290 B2
(45) Date of Patent: Nov. 25, 2025

(54) ACTIVE AREA SALICIDATION FOR NMOS AND PMOS DEVICES

(71) Applicant: Micron Technology, Inc., Boise, ID (US)

(72) Inventors: Ronald Allen Weimer, Boise, ID (US); Toshihiko Miyashita, Higashihiroshima (JP); Dan Mihai Mocuta, Boise, ID (US); Christopher W. Petz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 405 days.

(21) Appl. No.: 17/899,166

(22) Filed: Aug. 30, 2022

(65) Prior Publication Data

US 2024/0071832 A1 Feb. 29, 2024

(51) Int. Cl.
*H01L 21/285* (2006.01)
*H01L 21/02* (2006.01)
(Continued)

(52) U.S. Cl.
CPC ..... *H10D 84/017* (2025.01); *H01L 21/02532* (2013.01); *H01L 21/28518* (2013.01);
(Continued)

(58) Field of Classification Search
CPC ....... H01L 21/823814; H01L 21/02532; H01L 21/28518; H01L 27/092; H01L 29/0847; H01L 29/165; H01L 29/45; H01L 29/7848
See application file for complete search history.

(56) References Cited

U.S. PATENT DOCUMENTS

| 4,877,755 A * | 10/1989 | Rodder | H01L 21/76895 |
| | | | 148/DIG. 147 |
| 5,190,893 A * | 3/1993 | Jones, Jr. | H01L 23/53257 |
| | | | 257/E21.59 |

(Continued)

OTHER PUBLICATIONS

Deng, F, "Salicidation process using NiSi and its device application", Journal of Applied Physics 81, 8047, (1997), 6 pages.

(Continued)

*Primary Examiner* — Michelle Mandala
(74) *Attorney, Agent, or Firm* — Schwegman Lundberg & Woessner, P.A.

(57) ABSTRACT

A variety of applications can include apparatus having p-channel metal-oxide-semiconductor (PMOS) transistors and n-channel metal-oxide-semiconductor (NMOS) transistors with different metal silicide contacts. The active area of the NMOS transistor can include a first metal silicide having a first metal element, where the first metal silicide is a vertical lowest portion of a contact for the NMOS. The PMOS transistor can include a stressor source/drain region to a channel region of the PMOS transistor and a second metal silicide directly contacting the stressor source/drain region without containing the first metal element. The process flow to form the PMOS and NMOS transistors can enable making simultaneous contacts by a pre-silicide in the active area of the NMOS transistor, without affecting stressor source/drain regions in the PMOS transistor. The process flow and resulting structures for PMOS transistors and NMOS transistors can be used in various integrated circuits and devices.

15 Claims, 11 Drawing Sheets

(51) Int. Cl.
*H10D 30/69* (2025.01)
*H10D 62/13* (2025.01)
*H10D 62/822* (2025.01)
*H10D 64/62* (2025.01)
*H10D 84/01* (2025.01)
*H10D 84/03* (2025.01)
*H10D 84/85* (2025.01)

(52) U.S. Cl.
CPC ......... *H10D 30/797* (2025.01); *H10D 62/151* (2025.01); *H10D 62/822* (2025.01); *H10D 64/62* (2025.01); *H10D 84/038* (2025.01); *H10D 84/85* (2025.01)

(56) References Cited

U.S. PATENT DOCUMENTS

| | | | | |
|---|---|---|---|---|
| 6,043,537 | A * | 3/2000 | Jun | H10B 10/00 257/E21.654 |
| 7,084,061 | B2 * | 8/2006 | Sun | H01L 29/6659 438/682 |
| 7,554,110 | B2 * | 6/2009 | Yu | H01L 29/045 257/190 |
| 8,936,977 | B2 | 1/2015 | Hoentschel et al. | |
| 9,899,519 | B2 | 2/2018 | Wang et al. | |
| 2004/0029323 | A1 * | 2/2004 | Shimizu | H01L 21/823864 257/E21.345 |
| 2005/0247926 | A1 * | 11/2005 | Sun | H01L 21/823828 257/19 |
| 2007/0001233 | A1 * | 1/2007 | Schwan | H10D 30/0275 257/369 |
| 2007/0228482 | A1 * | 10/2007 | Wei | H01L 29/78684 257/E29.085 |
| 2008/0251851 | A1 * | 10/2008 | Pan | H10D 84/0167 257/E29.345 |
| 2014/0256109 | A1 * | 9/2014 | Yin | H01L 29/7843 438/300 |
| 2014/0361376 | A1 * | 12/2014 | Lii | H01L 21/28518 257/369 |
| 2016/0020301 | A1 * | 1/2016 | Park | H01L 21/823821 257/283 |
| 2021/0066452 | A1 * | 3/2021 | Liaw | H10D 30/43 |
| 2022/0130678 | A1 * | 4/2022 | Tseng | H10D 30/6211 |

OTHER PUBLICATIONS

He, Yonggen, "eSiGe global and micro loading effect study in high performance 45nm CMOS technology", ECS Transactions, 34 (1) 731-736 (2011)10.1149 1.3567665 The Electrochemical Society, (2011), 6 pages.

Li, C. I., "Mitigating eSiGe Strain Relaxation using Cryo-implantation Technology for PSD Formation", Ext. Abs. the 11th International Workshop on Junction Technology, (2011), 4 pages.

* cited by examiner

US 12,484,290 B2

ACTIVE AREA SALICIDATION FOR NMOS AND PMOS DEVICES

FIELD OF THE DISCLOSURE

Embodiments of the disclosure relate generally to integrated circuits, and more specifically, to devices having p-channel and n-channel metal-oxide-semiconductor like structures and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices and other electronic devices can be improved by enhancements to the design and fabrication of components of the electronic devices such as, but not limited to, n-channel metal-oxide-semiconductor (NMOS) transistors and p-channel metal-oxide-semiconductor (PMOS) transistors in an integrated circuit for the electronic devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
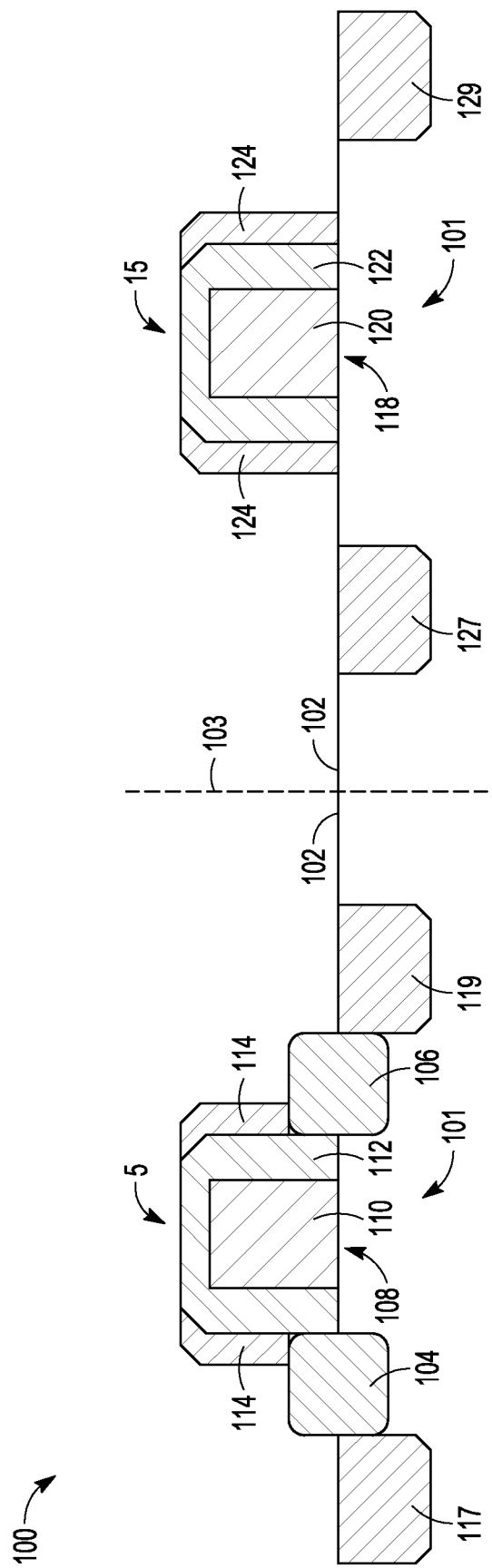
FIGS. 1-6 show features of an embodiment of an example process flow to form metal silicides for a PMOS transistor and form metal silicides for a NMOS transistor in an integrated circuit, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments can be utilized, and structural, logical, mechanical, and electrical changes can be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Metal oxide semiconductor field effect transistors (MOSFETs) can be implemented as NMOS transistors and PMOS transistors in an integrated circuit for an electronic device. MOSFETs can be structured with a metal gate separated from a semiconductor channel structure by a gate dielectric such as a thin oxide, or, in some architectures, with a doped semiconductor as a gate. The thin oxide can be, but is not limited to, silicon oxide ($SiO_x$). The gate dielectric can be a high-k dielectric. A high-k dielectric is a dielectric material having a dielectric constant greater than that of silicon dioxide ($SiO_2$). To enhance performance of a PMOS transistor, stressor source/drains can be used for the channel of the PMOS transistor. A stressor for a PMOS transistor is material that can exert a compressive force on a channel of the PMOS transistor that increases the mobility of the holes due to the compressor stress and thereby improves the device performance. More current can be generated for a given voltage by a PMOS transistor having a stressor as compared to the same PMOS transistor without the stressor.

A stressor region for a channel of a PMOS transistor can be implemented by embedded silicon germanium (eSiGe) source/drain (S/D) regions. The industry standard for contacts to the eSiGe S/D regions in the active area for PMOS transistors is titanium silicide ($TiSi_x$). However, in processes in which PMOS transistors and NMOS transistors are processed in a joint process flow, $TiSi_x$ can drastically increase contact resistance for the active areas of NMOS transistors relative to salicide contact metallization that can include, but is not limited to, a cobalt silicide (CoSi) or a nickel silicide (NiSi). Neither CoSi or NiSi works well with SiGe.

In various embodiments, a process flow for a PMOS transistor having stressor S/D regions and a NMOS transistor can include performing a salicide formation in the active area for the NMOS structure with a metal such as, but not limited to, Co, Ni, or platinum nickel (PtNi) prior to forming $TiSi_x$ on the stressor S/D regions for the PMOS structure. Salicide formation can include a series of annealing and etching. With Ti being a typical material used with through contacts to a metal silicide for a NMOS transistor, for example in DRAMs, the TiSi formation flow on the PMOS structure in a common process flow with the NMOS structure would effectively be transparent to the process for fabrication of the NMOS transistor. With $TiSi_x$ being a favored contact metal for 4 nm and below active areas for eSiGe PMOS transistors in logic circuits of memory devices, salicide formation for NMOS transistors of memory devices prior to the formation of the $TiSi_x$ to the eSiGe S/D regions for the PMOS transistors enables the use of through contacts to the eSiGe S/D regions for the PMOS transistor in the same process flow of through contacts to the silicide of the NMOS transistor. Salicidation of a NMOS structure prior to forming a contact to embedded stressor S/D regions of a PMOS structure enables a simple flow for process flow integration such as, but not limited to, complementary metal oxide semiconductor (CMOS) integration.

FIGS. 1-6 show features of an embodiment of an example process flow to form metal silicides for a PMOS transistor and form metal silicides for contacts for a NMOS transistor in an integrated circuit. The metal silicides are formed for contacts in the active areas for the NMOS transistor without affecting stressor S/D regions of the PMOS transistor.

FIG. 1 illustrates portions of a cross-sectional representation of a structure 100 for an integrated circuit having a PMOS structure 5 and a NMOS structure 15 as an example starting point for a process flow to form metal silicides to stressor S/D regions 104 and 106 of PMOS structure 5 and to form metal silicides for contacts in the active area for NMOS structure 15. There can be regions in PMOS structure 5 and NMOS structure 15 that are not shown for ease of presentation of the process flow of FIGS. 1-6. PMOS structure 5 can include a gate stack 110 above a channel region 108. A capping region 112 can contact the sides and top of gate stack 110. Spacers 114 are positioned on the sides of capping region 112. Stressor S/D regions 104 and 106 can be located in larger source or drain regions, where stressor S/D region 104 and stressor S/D region 106 are separated from each other by channel region 108. PMOS structure 5 can be situated between shallow trench isolation (STI) 117 and STI 119 from a surface 102 of a substrate 101.

Stressor S/D regions 104 and 106 can be implemented as eSiGe regions. Alternatively, stressor S/D regions 104 and 106 can be implemented using other semiconductor materials having a lattice larger than the substrate on which the stressor S/D regions are formed. With substrate 101 being silicon, stressor S/D regions 104 and 106 can be implemented using semiconductor materials having a lattice larger than silicon. Stressor S/D regions 104 and 106 can be implemented by an epitaxial film designed to induce a stress on channel region 108. A silicon epitaxial film can be formed with germanium concentration from 10% to 80% that can be in layers to provide a substantially silicon germanium region. Stressor S/D regions 104 and 106 can be doped with boron or other p-type dopant.

NMOS structure 15 can include a gate stack 120 above a channel region 118. A capping region 122 can contact the sides and top of gate stack 120. Spacers 124 can be positioned on the sides of capping region 122. NMOS structure 15 can be situated between shallow trench isolations (STI) 127 and STI 129 from surface 102 of substrate 101. NMOS structure 15 can be structured in a different region of an integrated circuit separate from PMOS structure 5, as indicated by dotted line 103. Alternatively, PMOS structure 5 and NMOS structure 15 can be structured for a CMOS device in the integrated circuit. The integrated circuit can be, but is not limited to, a memory device.

Each of gate stack 110 and gate stack 120 can be structured having a gate dielectric on surface 102 on which is located a metal gate or a polysilicon gate. The gate dielectric can include one or more dielectrics including, but not limited to, a high-k. The high-k dielectric can be located on a thin silicon oxide that contacts surface 102. A polysilicon region can be located on the gate with one or more metals to transition to a contact above the polysilicon region. The one or more transitioning metals can include, but are not limited to, Ti, tungsten nitride ($WN_x$), and $WSi_x$, and the contact can be, but is not limited to, W. Capping region 112 and capping region 122 can be implemented as a nitride cap and nitride spacer surrounding the gate material. Spacers 114 and 124 can be oxide spacers such as, but not limited to, a silicon oxide. Alternatively, spacers 114 and 124 can be nitride spacers such as, but not limited to, a silicon nitride ($SiN_x$). Spacers 114 and 124 can be structured as combinations of one or more oxides and one or more nitrides.

Figure 2:
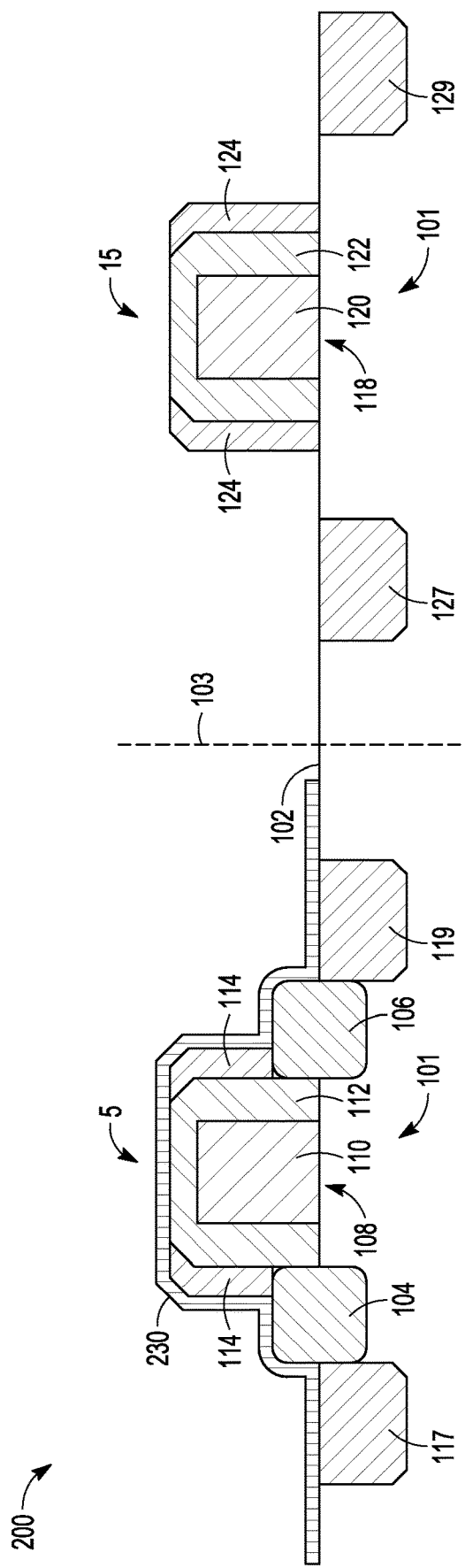

FIG. 2 shows a cross-sectional representation of a structure 200 after forming a mask on the surface of structure 100 including covering PMOS structure 5 and NMOS structure 15. In structure 200, the mask has been removed, leaving a mask 230 on PMOS structure 5. Mask 230 is formed to protect PMOS structure 5 during the salicidation of contacts in the active area of NMOS structure 15. Formation of mask 230 can include an appropriate deposition using photolithography followed by an appropriate removal from NMOS, such as by etching. Photolithography can include a patterning process in which a formed photosensitive polymer is selectively exposed to light through a mask, leaving an image in the photosensitive polymer, where the imaged photosensitive polymer can then be selectively removed yielding a patterned access to an underlying structure. The selection of deposition and etching processes can depend on the materials used for mask 230. For typical mask materials, conventional photolithographic and etching processes can be utilized.

Figure 3:
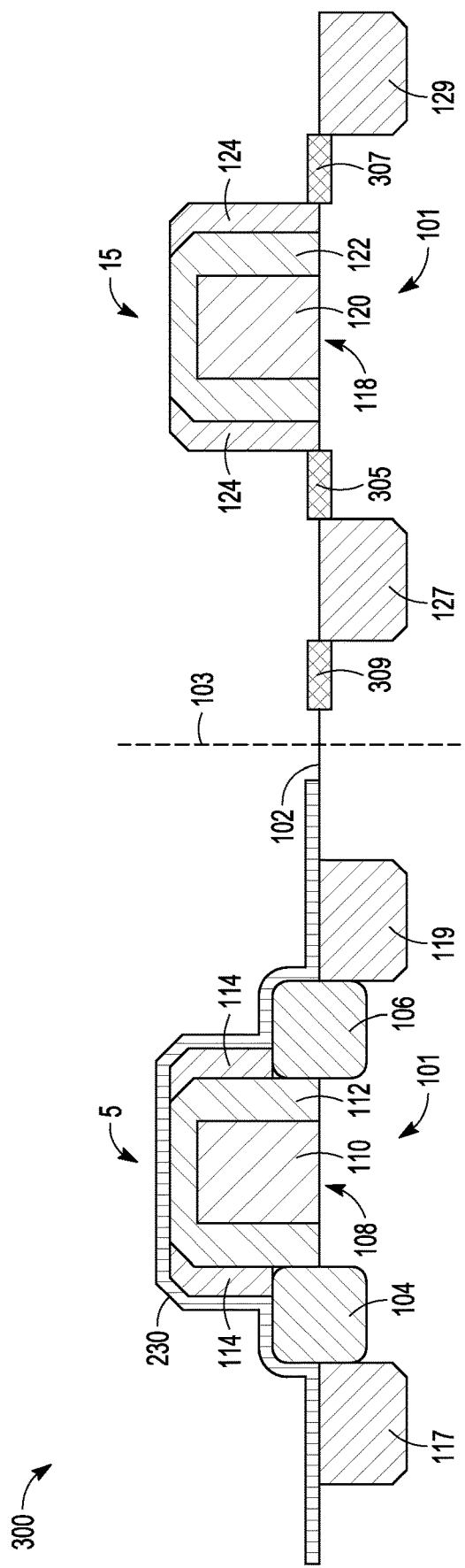

FIG. 3 shows a cross-sectional representation of a structure 300 after salicide formation in NMOS structure 15 of structure 200 of FIG. 2, while maintaining mask 230 on PMOS structure 5. One or more metals have been formed on surface 102. The one or more metals can include one or more of Ni, Co, Pt, W, or other appropriate metal or combinations thereof. The formation of the metals on surface 102 can be performed by depositing these materials using an appropriate deposition process for the selected metal. After the forming of the one or more metals, the salicide formation in NMOS structure 15 can include annealing, removing portions of the metal from areas that are to be separate from the formed contacts, and annealing after the removal of the metal portions. The removal process can include, but is not limited to, wet etching. The formed structure 300 can include metal silicide contacts 305, 307, and 309. The metal silicide contacts 305, 307, and 309 can include one or more of $NiSi_x$, $CoSi_x$, $PtSi_x$, $WSi_x$, or combinations thereof. In various embodiments, metal silicide contacts 305, 307, and 309 can be formed on epitaxial doped silicon in the active region. The doping can include, but is not limited to, phosphorus. A number of appropriate techniques can be implemented to provide the epitaxial doped silicon on which metal silicide contacts 305, 307, and 309 can be formed.

Figure 4:
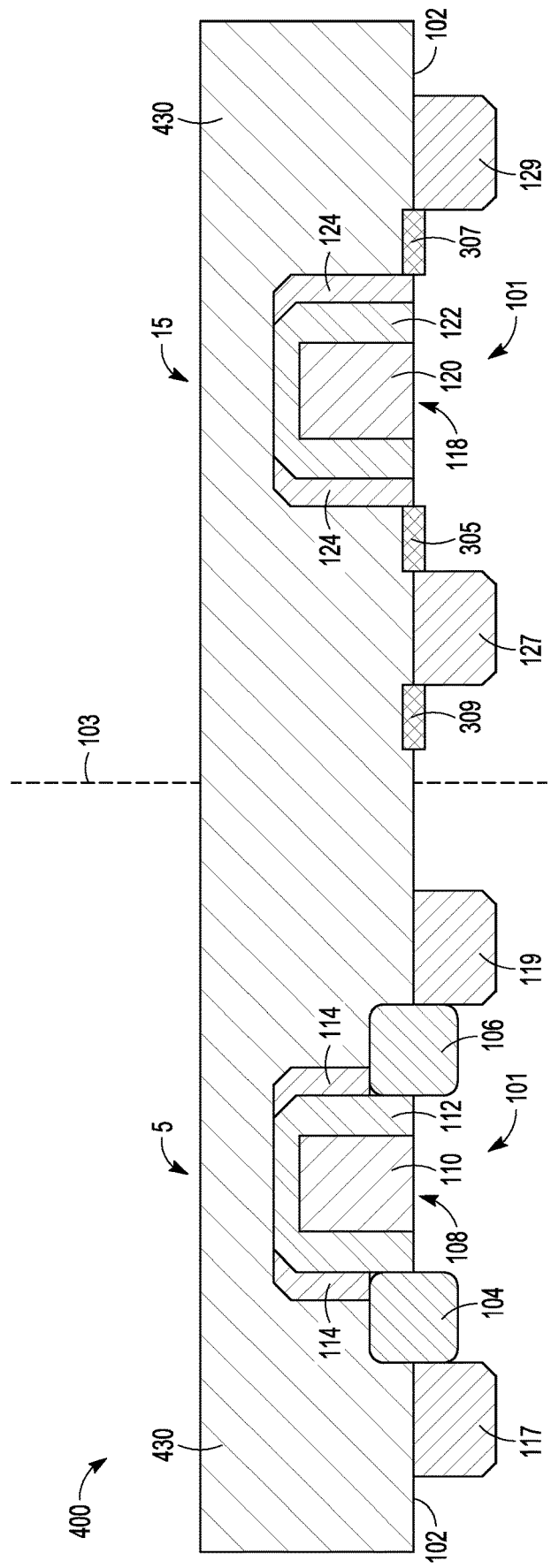

FIG. 4 shows a cross-sectional representation of a structure 400 after processing structure 300 of FIG. 3. Mask 230 has been removed and a backend-of-the-line (BEOL) module has been built. BEOL is a stage of manufacturing semiconductor devices in which interconnects within the semiconductor device are formed. BEOL can include formation of the metal runners and lines that can operationally carry signals to the PMOS and NMOS devices. Layers of W and copper (Cu) on top of the PMOS and NMOS devices can be built in the BEOL module that use the contacts being formed in the process flow of FIGS. 1-6. A dielectric 430 has been formed covering PMOS structure 5 and NMOS structure 15.

Figure 5:
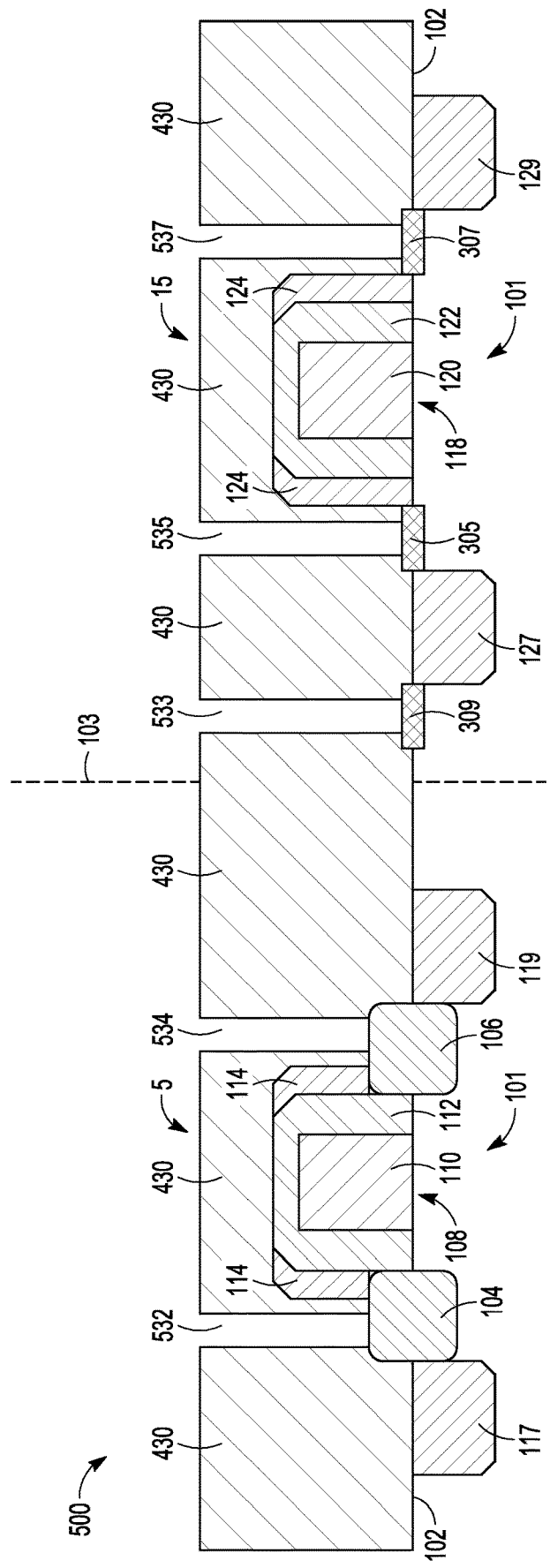

FIG. 5 shows a cross-sectional representation of a structure 500 after processing structure 400 of FIG. 4. An opening 532 in dielectric 430 to stressor S/D region 104 of PMOS structure 5 and an opening 534 in dielectric 430 to stressor S/D region 106 of PMOS structure 5 have been formed. An opening 533 in dielectric 430 to metal silicide contact 309 of NMOS structure 15, an opening 535 in dielectric 430 to metal silicide contact 305 of NMOS structure 15, and an opening 537 in dielectric 430 to metal silicide contact 307 of NMOS structure 15 have been formed. Forming of openings 532, 534, 533, 535, and 537 can be performed using photolithography followed by an appropriate removal of portions of dielectric 430, such as by etching.

Figure 6:
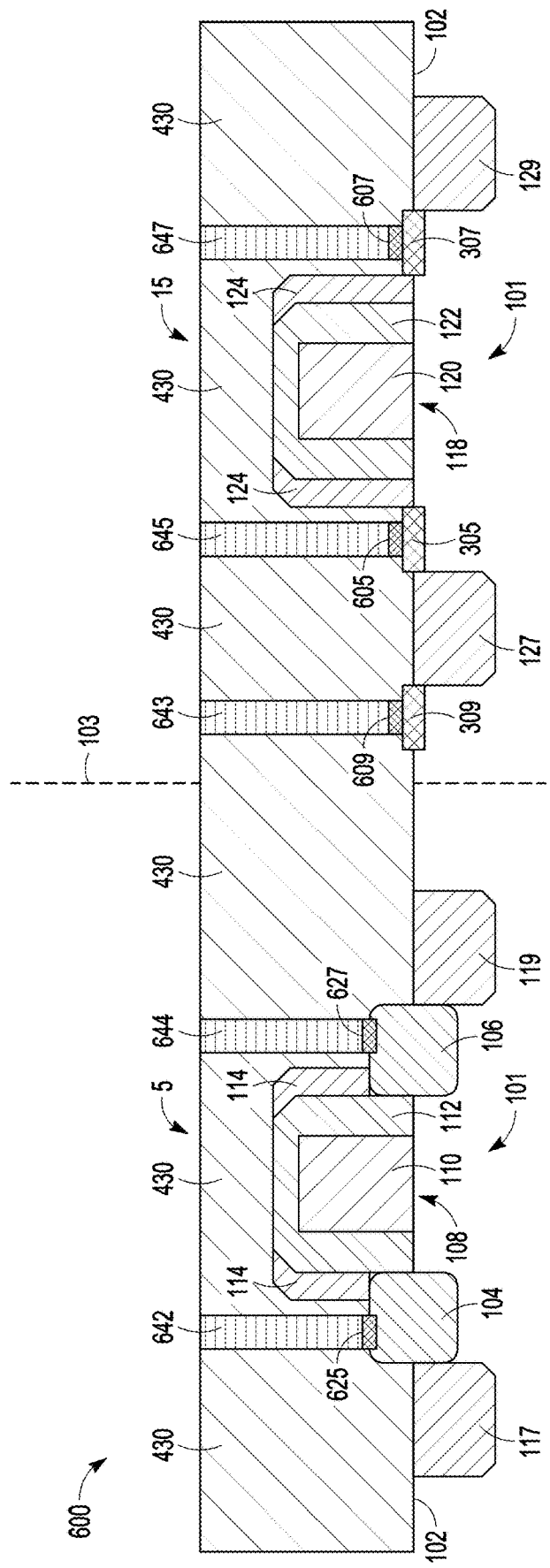

FIG. 6 shows a cross-sectional representation of a structure 600 after processing structure 500 of FIG. 5. The openings 532, 534, 533, 535, and 537 of structure 500 have been filled with one or more metals to form contacts in PMOS structure 5 and contacts NMOS structure 15. After filing these openings that provides one or more metals for contact structures 642, 644, 643, 645, and 647, structure 600 can be annealed. Alternatively, with more than one metal formed in the openings 532, 534, 533, 535, and 537 of structure 500, annealing can be conducted after inserting each metal of the set of metals being used to fill these openings. The metals filling openings 532, 534, 533, 535, and 537 can include, but are not limited to, Ti, TiN, TiW, or W. In various embodiments, Ti is formed first in the openings 532, 534, 533, 535, and 537 to interact with the material of stressor S/D regions 104 and 106 and the metal silicide contacts 305, 307, and 309. In various embodiments, metal silicide contacts 305, 307, and 309 can be structured on epitaxial doped silicon in the active region. The doping can include, but is not limited to, phosphorus. With stressor S/D regions 104 and 106 being eSiGe regions, the Ti can be used to first fill openings 532, 534, 533, 535, and 537 to form TiSix 625 and 627 contacting stressor S/D regions 104 and 106, respectively, and $TiSi_x$ 605, 607, and 609 contacting metal silicide contacts 305, 307, and 309, respectively, previously formed. After forming $TiSi_x$ at the bottom of openings 532, 534, 533, 535, and 537, other metals can be formed on the $TiSi_x$. These other metals can fill the openings 532, 534, 533, 535, and 537 to the top of these openings.

The process flow of FIGS. 1-6 can be implemented to form multiple PMOS transistors and NMOS transistors in an integrated circuit, where the process flow enables making simultaneous contacts to active areas of the NMOS transistors and to active areas of the PMOS transistors, by a pre-silicide in the active area of the NMOS transistors, without affecting stressor S/D regions in the active areas of the PMOS transistors. The process flow and resulting structures for PMOS transistors and NMOS transistors can be used in various integrated circuits and devices. For example, the process flow and resulting structures for PMOS transistors and NMOS transistors can be used in memory devices. These PMOS transistors and NMOS transistors can be formed in logic regions of DRAMs or periphery regions to memory arrays in flash memories. The process flow and resulting structures for PMOS transistors and NMOS transistors can be used in forming CMOS devices or implementing CMOS-based technologies.

Various deposition techniques for components of structures 100-600 in the process flow of FIGS. 1-6 can be used that are typical for the material being formed, the dimensions of the material being formed, and the architecture in which the material is being formed. Processes for forming the various materials can include, but are not limited to, chemical vapor deposition (CVD), atomic layer deposition (ALD), and physical vapor deposition (PVD). PVD can include, but is not limited to, sputtering, ion beam deposition, electron beam evaporation, pulsed laser deposition, and vacuum arc methods, among others. CVD can include, but is not limited to, plasma chemical vapor deposition, and laser chemical vapor deposition, among others. Selective etching and conventional masking techniques can be used to remove selected regions in the processing discussed with respect to FIGS. 1-6. Etching procedures can include, but is not limited to, wet etching, dry etching, and atomic layer etching deposition, among others.

Figure 7:
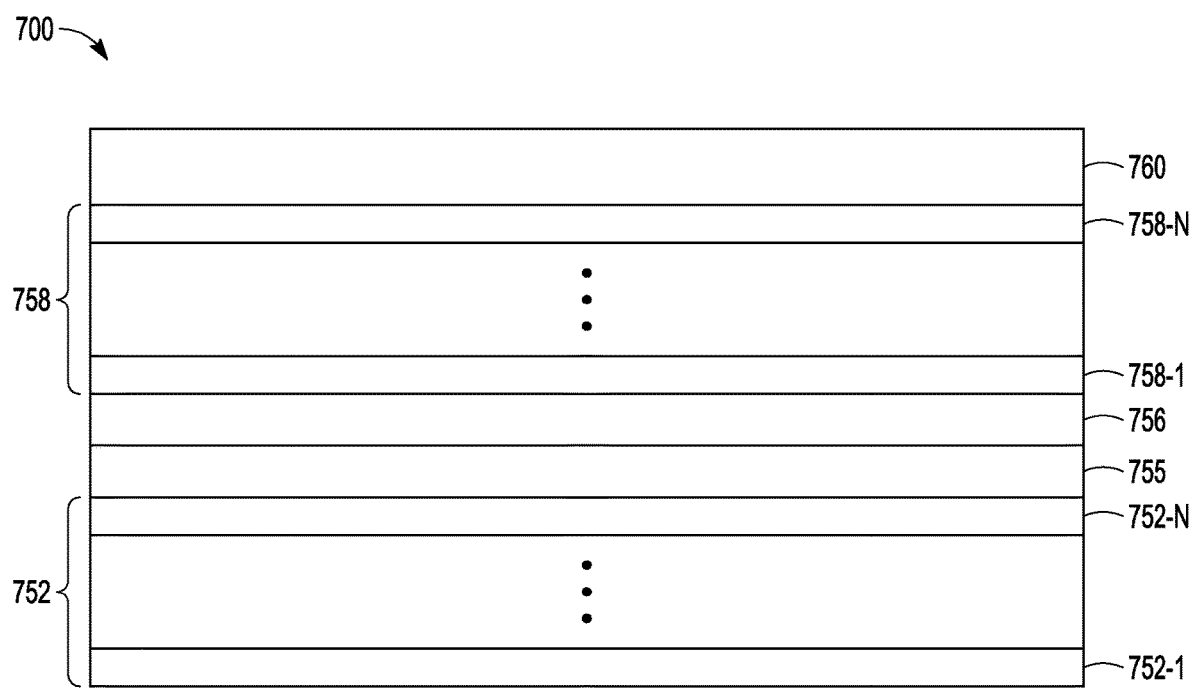
FIG. 7 is a representation of an example gate stack that can be used in the gate stacks of FIGS. 1-6, according to various embodiments.

FIG. 7 is a representation of an embodiment of an example gate stack 700 that can be used in the gate stacks 110 and 120 of FIGS. 1-6. Gate stack 700 can include a gate dielectric 752 that can be located on a channel region of a PMOS structure or a channel region of a NMOS structure. Gate dielectric 752 can include one or more dielectrics 752-1 . . . 752-N. The dielectrics 752-1 . . . 752-N can include silicon oxide or one or more high-k dielectrics. The lowest dielectric 752-1 can include silicon oxide with dielectric 752-N, with N=2, being a high-k dielectric. A gate 755 can be located on and contacting gate dielectric 752. A polysilicon region 756 can be located on an contacting gate 755. A barrier metal region 758 can be located between polysilicon region 756 and a contact 760. Barrier metal region 758 can be structured as a set of one or more barrier metals 758-1 . . . 758-N. Barrier metals 758-1 . . . 758-N can include one or more metals such as, but not limited to, Ti, WN, or $WSi_x$. Contact 760 can include, but is not limited to, W.

Figure 8:
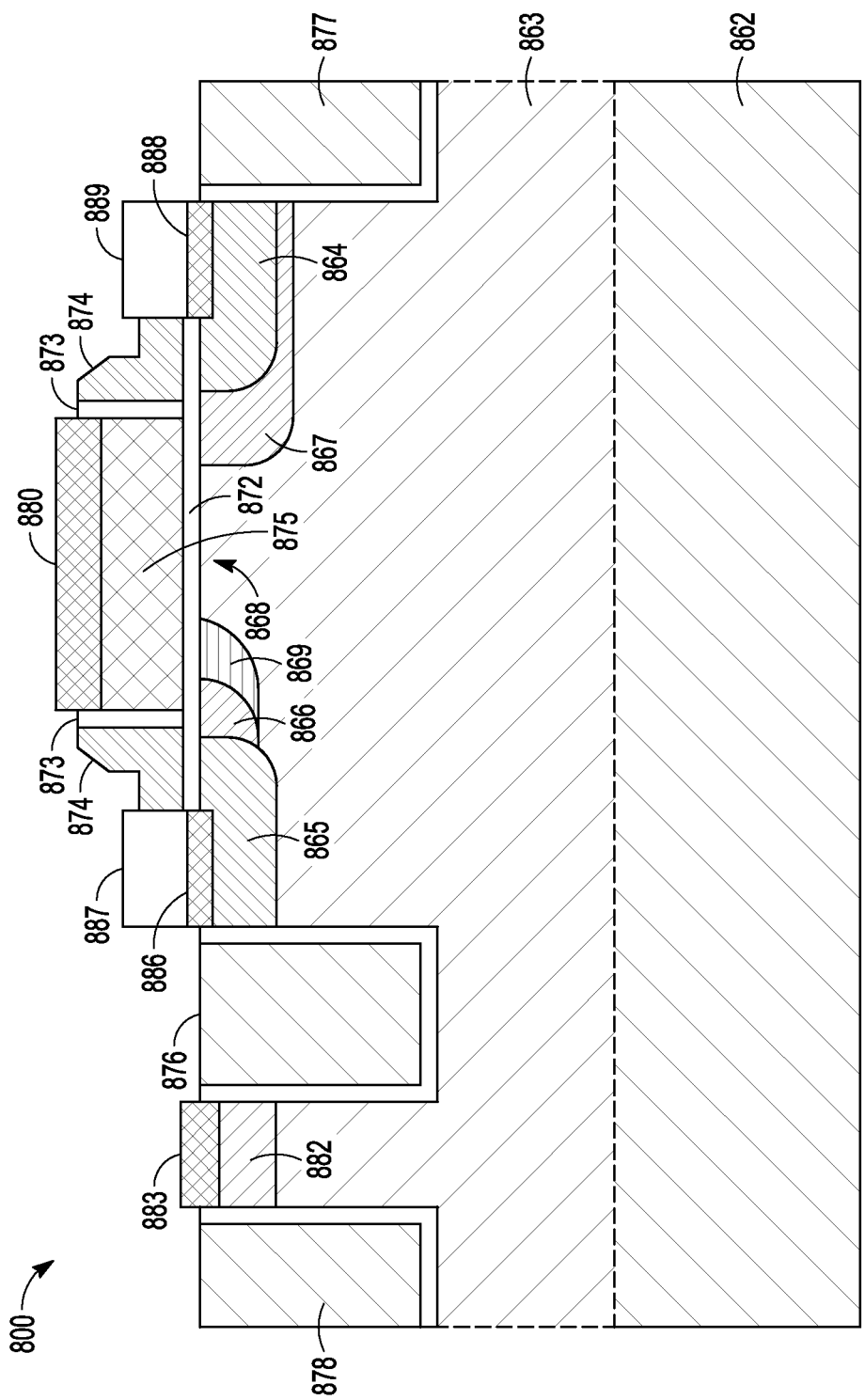
FIG. 8 is a representation of a metal oxide semiconductor transistor structure for the PMOS and NMOS structure of FIGS. 1-6 after completion of the device formed including the process flow, according to various embodiments.

FIG. 8 is a cross-sectional representation of an embodiment of a metal oxide semiconductor transistor format 800 for the PMOS and NMOS structures of FIGS. 1-6 after completion of the device formed including the process flow of FIGS. 1-6. Format 800 can include a channel 868 between a S/D region 865 and a S/D region 864 in a well 863 on a substrate 862. Substrate 862 can be an epitaxial substrate. The conductivity type (n-type or p-type) of well 863 can be p-type for a NMOS structure and n-type for a PMOS structure. For a PMOS structure, S/D regions 865 and 864 can include eSiGe regions doped p-type, while S/D regions 865 and 864 for the NMOS structure is doped n-type without eSiGe regions. S/D region 865 can be separated from channel 868 by a lightly doped drain (LDD) region 866 and S/D region 864 can be separated from channel 868 by LDD region 867. For S/D region 865 implemented as a source, a halo region 869 can be situated between LDD region 866 and channel 868. A halo region is a doped region with implants to reduce a short channel effect. Format 800 includes STI 876 and STI 877 to isolate active components between these STI regions from unwanted electrical conductivity to exterior components of the integrated circuit for which the PMOS and NMOS structures are included.

A gate stack is located above channel 868, where the gate stack can include a gate dielectric 872 with a gate structure 875 located on the gate dielectric 872. A gate contact 880 contacts gate structure 875. Gate dielectric 872 can be structured similar to gate dielectric 752 of gate stack 700 of FIG. 7. Gate structure 875 can be structured similar to gate 755 of gate stack 700 of FIG. 7 and can include one or more of polysilicon region 756, barrier metal region 758, or portions of barrier metal region 758 of gate stack 700 of FIG. 7. Gate contact 880 can be structured similar to contact 760 of FIG. 7.

Side capping regions 873 can contact the sides of gate structure 875. Spacers 874 are positioned on the sides of side capping region 873. Side capping region 873 can be implemented as a nitride cap and nitride spacer surrounding the gate material of gate structure 875. Spacers 874 can be oxide spacers such as, but not limited to, a silicon oxide. Alternatively, spacers 874 can be nitride spacers such as, but not limited to, a silicon nitride. Spacers 874 can be structured as combinations of one or more oxides and one or more nitrides. Side capping regions 873 and spacers 874 can be structured similar to the corresponding regions in the structures of FIGS. 1-6. Side capping regions 873, spacers 874, and the gate stack of format 800 can be used to form LDD regions 866 and 867, which formation can be performed immediate post gate formation or post formation of the protective spacer between the gate material and the implant, where the protective spacer that protects and offsets the dopant from the channel.

Format 800 can include a metal silicide region 886 contacting S/D region 865 coupling S/D region 865 to a metal contact 887 and a metal silicide region 888 contacting S/D region 864 coupling S/D region 864 to a metal contact 889. For the PMOS structure in the process flow of FIGS. 1-6, S/D regions 865 and 864 can be eSiGe contacted by a first silicide of metal silicide regions 886 and 888 formed as TiSix. For the NMOS structure in the process flow of FIGS. 1-6, S/D regions 865 and 864 can be non-stressor regions contacted by a first silicide of metal silicide regions 886 and 888 formed as a metal silicide different from $TiSi_x$ such as, but not limited to, $NiSi_x$, $CoSi_x$, $PtSi_x$, combinations thereof, or other metal silicides. A first metal silicide can be structured in a vertically lowest portion of a contact in an active region for the NMOS structure, where the first metal silicide includes a first metal element, and a second metal silicide can be structured directly contacting the stressor S/D regions for the PMOS structure, where the second metal silicide is structured without containing the first metal element. The active area of the NMOS structure can include other contacts with a metal silicide, other than $TiSi_x$, being a lowest metal silicide in a vertical structure for these other contacts. The salicide formation in the NMOS structure, performed without affecting stressor S/D regions of the PMOS structure, allows for contacts, not shown in the plane of view of FIG. 8, anywhere in the active area for the NMOS structure. As shown in FIG. 8, a metal silicide region 882 can contact well 863 for the body of the NMOS structure, which arrangement couples well 863 to a metal contact 883. Metal silicide region 882 can be situated between a STI 878 and STI 876.

Figure 9:
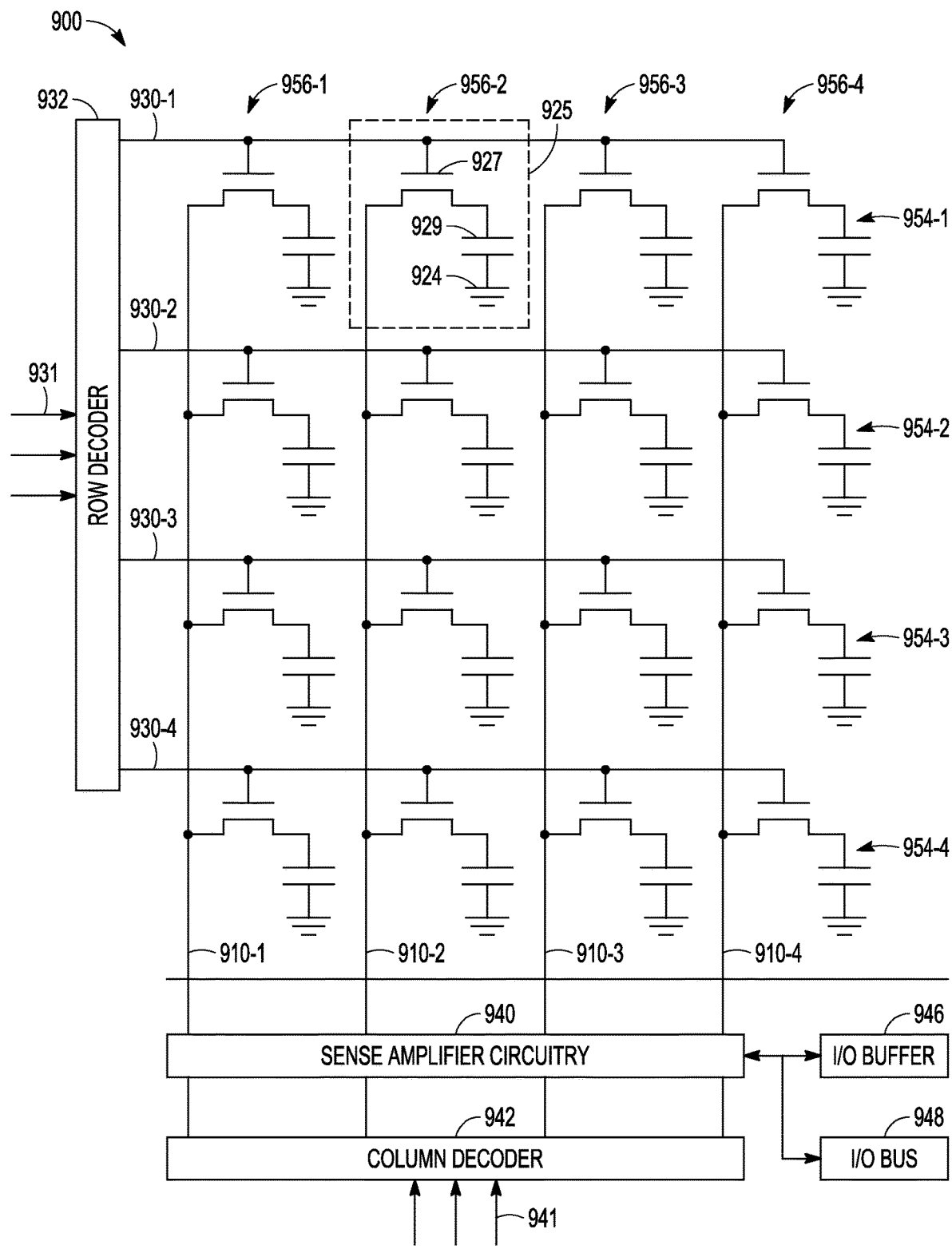
FIG. 9 is a schematic of an example dynamic random-access memory device that can include an architecture having one or more metal silicides for a PMOS transistor and one or more metal silicides for contacts in an active area for a NMOS transistor in an integrated circuit, according to various embodiments.

FIG. 9 is a schematic of an embodiment of an example DRAM device 900 that can include an architecture having a memory array region and periphery circuits to the memory array, in which is located a PMOS having a stressor source/drain region to a channel region of the PMOS transistor and a NMOS transistor as discussed herein with respect to FIGS. 1-6. A first metal silicide is located in a vertically lowest portion of a contact in the active area of the NMOS transistor, where the first metal silicide includes a first metal element, and a second metal silicide contacts the stressor source/drain region, with the second metal silicide structured without containing the first metal element. These PMOS transistors and NMOS transistors can be formed in logic regions of DRAM device 900 or periphery regions to a memory array of DRAM device 900. The PMOS and NMOS can be structured in an integrated circuit of DRAM device 900 in a common process flow.

DRAM device 900 can include an array of memory cells 925 (only one being labeled in FIG. 9 for ease of presentation) arranged in rows 954-1, 954-2, 954-3, and 954-4 and columns 956-1, 956-2, 956-3, and 956-4. For simplicity and ease of discussion, the array is shown in only two dimensions, but the array can be extended into the third dimension. Further, while only four rows 954-1, 954-2, 954-3, and 954-4 and four columns 956-1, 956-2, 956-3, and 956-4 of four memory cells are illustrated, DRAM devices like DRAM device 900 can have significantly more memory cells 925 (e.g., tens, hundreds, or thousands of memory cells) per row or per column.

Each memory cell 925 can include a single transistor 927 and a single capacitor 929, which is commonly referred to as a 1T1C (one-transistor—one capacitor cell). One plate of capacitor 929, which can be termed the "node plate," is connected to the drain terminal of transistor 927, whereas the other plate of the capacitor 929 is connected to ground 924. Each capacitor 929 within the array of 1T1C memory cells 925 typically serves to store one bit of data, and the respective transistor 927 serves as an access device to write to or read from storage capacitor 929.

The transistor gate terminals within each row of rows 954-1, 954-2, 954-3, and 954-4 are portions of respective access lines 930-1, 930-2, 930-3, and 930-4 (alternatively referred to as "word lines"), and the transistor source terminals within each of columns 956-1, 956-2, 956-3, and 956-4 are electrically connected to respective digit lines 910-1, 910-2, 910-3, and 910-4 (alternatively referred to as "bit lines"). A row decoder 932 can selectively drive the individual access lines 930-1, 930-2, 930-3, and 930-4, responsive to row address signals 931 input to row decoder 932. Driving a given access line at a high voltage causes the access transistors within the respective row to conduct, thereby connecting the storage capacitors within the row to the respective data lines, such that charge can be transferred between the data lines and the storage capacitors for read or write operations. Both read and write operations can be performed via sense amplifier circuitry 940, which can transfer bit values between the memory cells 925 of the selected row of the rows 954-1, 954-2, 954-3, and 954-4 and input/output buffers 946 (for write/read operations) or external input/output data buses 948.

A column decoder 942 responsive to column address signals 941 can select which of the memory cells 925 within the selected row is read out or written to. Alternatively, for read operations, the storage capacitors 929 within the selected row can be read out simultaneously and latched, and the column decoder 942 can then select which latch bits to connect to the output data bus 948. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

DRAM device 900 can be implemented as an integrated circuit within a package that includes pins for receiving supply voltages (e.g., to provide the source and gate voltages for the transistors 927) and signals (including data, address, and control signals). FIG. 9 depicts DRAM device 900 in simplified form to illustrate basic structural components, omitting many details of the memory cells 925 and associated access lines 930-1, 930-2, 930-3, and 930-4 and digit lines 910-1, 910-2, 910-3, and 910-4 as well as the peripheral circuitry. For example, in addition to the row decoder 932 and column decoder 942, sense amplifier circuitry 940, and buffers 946, DRAM device 900 can include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) DRAM arrays, the rows 954-1, 954-2, 954-3, and 954-4 and columns 956-1, 956-2, 956-3, and 956-4 of memory cells 925 are arranged along a single horizontal plane (i.e., a plane parallel to the layers) of the semiconductor substrate, e.g., in a rectangular lattice with mutually perpendicular horizontal access lines 930-1, 930-2, 930-3, and 930-4 and digit lines 910-1, 910-2, 910-3, and 910-4. In 3D DRAM arrays, the memory cells 925 are arranged in a 3D lattice that encompasses multiple vertically stacked horizontal planes corresponding to multiple device tiers of a multi-tier substrate assembly, with each device tier including multiple parallel rows of memory cells 925 whose transistor gate terminals are connected by horizontal access lines such as access lines 930-1, 930-2, 930-3, and 930-4. (A "device tier," as used herein, can include multiple layers (or levels) of materials, but forms the components of memory devices of a single horizontal tier of memory cells.) Digit lines 910-1, 910-2, 910-3, and 910-4 extend vertically through all or at least a vertical portion of the multi-tier structure, and each of the digit lines 910-1, 910-2, 910-3, and 910-4 connects to the transistor source terminals of respective vertical columns 956-1, 956-2, 956-3, and 956-4 of associated memory cells 925 at the multiple device tiers. This 3D configuration of memory cells enables further increases in bit density compared with 2D arrays.

Figure 10:
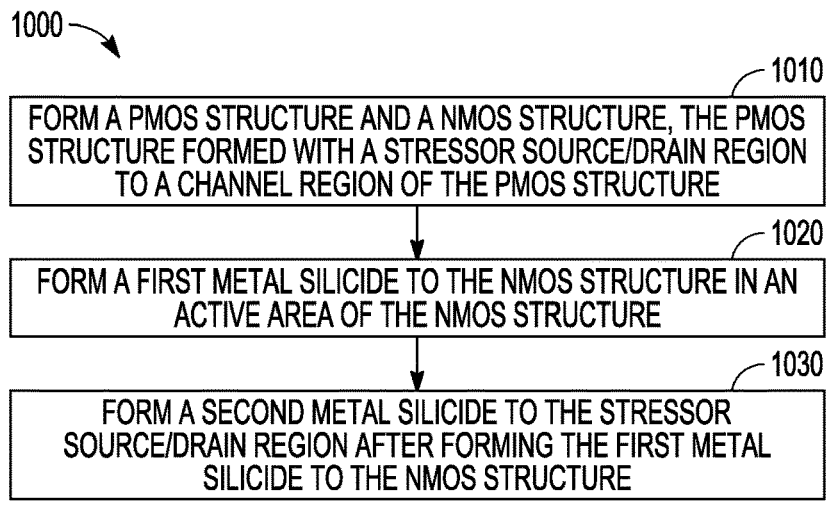
FIG. 10 is a flow diagram of features of an example method of active area salicidation for both a NMOS transistor and a PMOS transistor in an integrated circuit, according to various embodiments.

FIG. 10 is a flow diagram of features of an embodiment of an example method 1000 of active area salicidation for both a NMOS transistor and a PMOS transistor. At 1010, a PMOS structure and a NMOS structure are formed. The PMOS structure is formed with at least one stressor S/D region to a channel region of the PMOS structure. At 1020, a first metal silicide is formed to the NMOS structure in an active area of the NMOS structure. At 1030, a second metal silicide is formed to the at least one S/D stressor region of the PMOS structure after forming the first metal silicide to the NMOS structure. An embedded silicon germanium region can be formed as the stressor region.

Variations of method 1000 or methods similar to method 1000 can include a number of different embodiments that can be combined depending on the application of such methods and/or the architecture of systems in which such methods are implemented. Such methods can include forming material of the second metal silicide on and contacting the first metal silicide to the NMOS structure. Forming the material of the second metal silicide on and contacting the first metal silicide can occur while forming the second metal silicide on the at least one S/D stressor region of the PMOS structure.

Variations of method 1000 or methods similar to method 1000 can include forming the first metal silicide by performing a salicide formation of the NMOS structure with cobalt or nickel. Variations can include forming titanium silicide, as the second metal silicide, contacting the at least one S/D stressor region of the PMOS structure. In addition, titanium can be provided contacting the first metal silicide with the first metal silicide formed as a cobalt silicide or a nickel silicide before providing the titanium.

Figure 11:
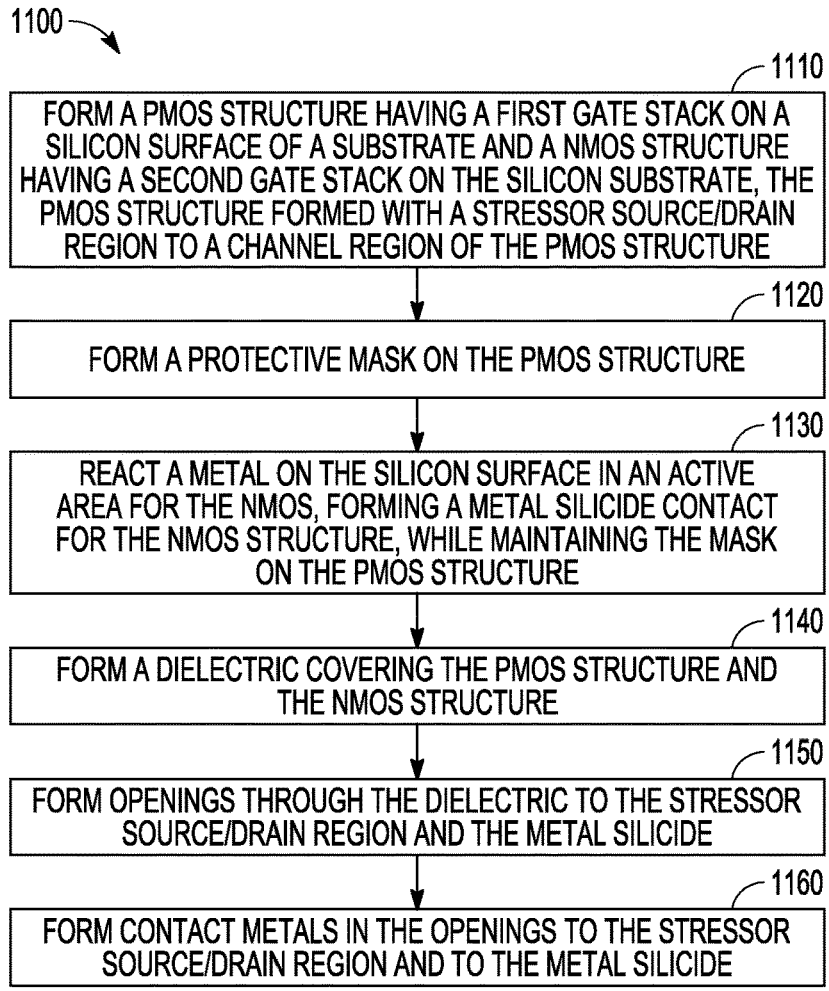
FIG. 11 is another flow diagram of features of an example method of active area salicidation for both a NMOS transistor and a PMOS transistor in an integrated circuit, according to various embodiments.

FIG. 11 is a flow diagram of features of an embodiment of another example method 1100 of active area salicidation for both a NMOS transistor and a PMOS transistor. At 1110, a PMOS structure having a first gate stack on a silicon surface of a substrate and a NMOS structure having a second gate stack on the silicon substrate. The PMOS structure can be formed with at least one S/D stressor region to a channel region of the PMOS structure. The at least one S/D stressor region of the PMOS structure can include embedded silicon germanium.

At 1120, a protective mask is formed on the PMOS structure. A 1130, a metal is reacted on the silicon surface in an active area for the NMOS, forming a metal silicide contact for the NMOS structure. The mask is maintained on the PMOS structure, while forming the metal silicide contact for the NMOS structure. Cobalt, nickel, platinum, or combinations thereof can be reacted on the silicon surface. Other metals can be used in forming the metal silicide for the NMOS structure. At 1140, a dielectric is formed covering the PMOS structure and the NMOS structure. At 1150, openings are formed through the dielectric to the at least one S/D stressor region of the PMOS structure and to the metal silicide. At 1160, contact metals are formed in the openings to the at least one S/D stressor region of the PMOS structure and to the metal silicide.

Variations of method 1100 or methods similar to method 1100 can include a number of different embodiments that can be combined depending on the application of such methods and/or the architecture of systems in which such methods are implemented. Such methods can include forming the protective mask on the NMOS structure when forming the protective mask on the PMOS structure and removing the protective mask from the NMOS structure before reacting the metal on the silicon surface.

Variations of method 1100 or methods similar to method 1100 can include forming one or more of the contact metals in the openings after forming a silicide contacting the at least one S/D stressor region of the PMOS structure. Titanium silicide can be formed as the silicide contacting the at least one S/D stressor region of the PMOS structure. Variations can include filling the openings with the contact metals followed by annealing. Titanium, titanium nitride, or tungsten can be used in filling the openings. With multiple metals formed in the openings, in which one of the metals is titanium, the first metal inserted into the openings can be titanium. With titanium first inserted into the openings, a titanium silicide can be formed contacting the at least one S/D stressor region of the PMOS structure and a titanium silicide can be formed contacting the metal silicide contact for the NMOS structure.

The fabrication techniques used in methods 1000, 1100, or methods similar to methods 1000 and 1100 can use conventional techniques for removing material such as masking, etching, and other removal processes. The formation techniques can use conventional techniques for forming materials in semiconductor based memory devices. Formation techniques can include deposition processes such as, but not limited to, chemical vapor deposition and atomic layer deposition.

In various embodiments, an electronic device can comprise a PMOS transistor and a NMOS transistor in which contacts are simultaneously made in active areas of the PMOS transistor and the NMOS transistor, where the PMOS transistor has at least one stressor S/D region contacting the channel region of the PMOS transistor. The PMOS transistor can have a first gate stack and the NMOS transistor can have a second gate stack. A first metal silicide is located in a vertically lowest portion of a contact in the active area of the NMOS transistor and a second metal silicide is located contacting the at least one S/D stressor region of the PMOS transistor. The first metal silicide in the active area for the NMOS transistor can include a first metal element that is not contained in the second metal silicide contacting the at least one S/D stressor region of the PMOS transistor.

Variations of such an electronic device and its features, as taught herein, can include a number of different embodiments and features that can be combined depending on the application of such electronic devices, the format of such electronic devices, and/or the architecture in which such electronic devices are implemented. Features of such electronic devices can include a second metal element of the second silicide on and contacting the first metal silicide. The second metal element can be titanium. Variations can include the first metal element selected from one or more of nickel, cobalt, or platinum. The at least one stressor S/D region can include embedded silicon germanium.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Figure 12:
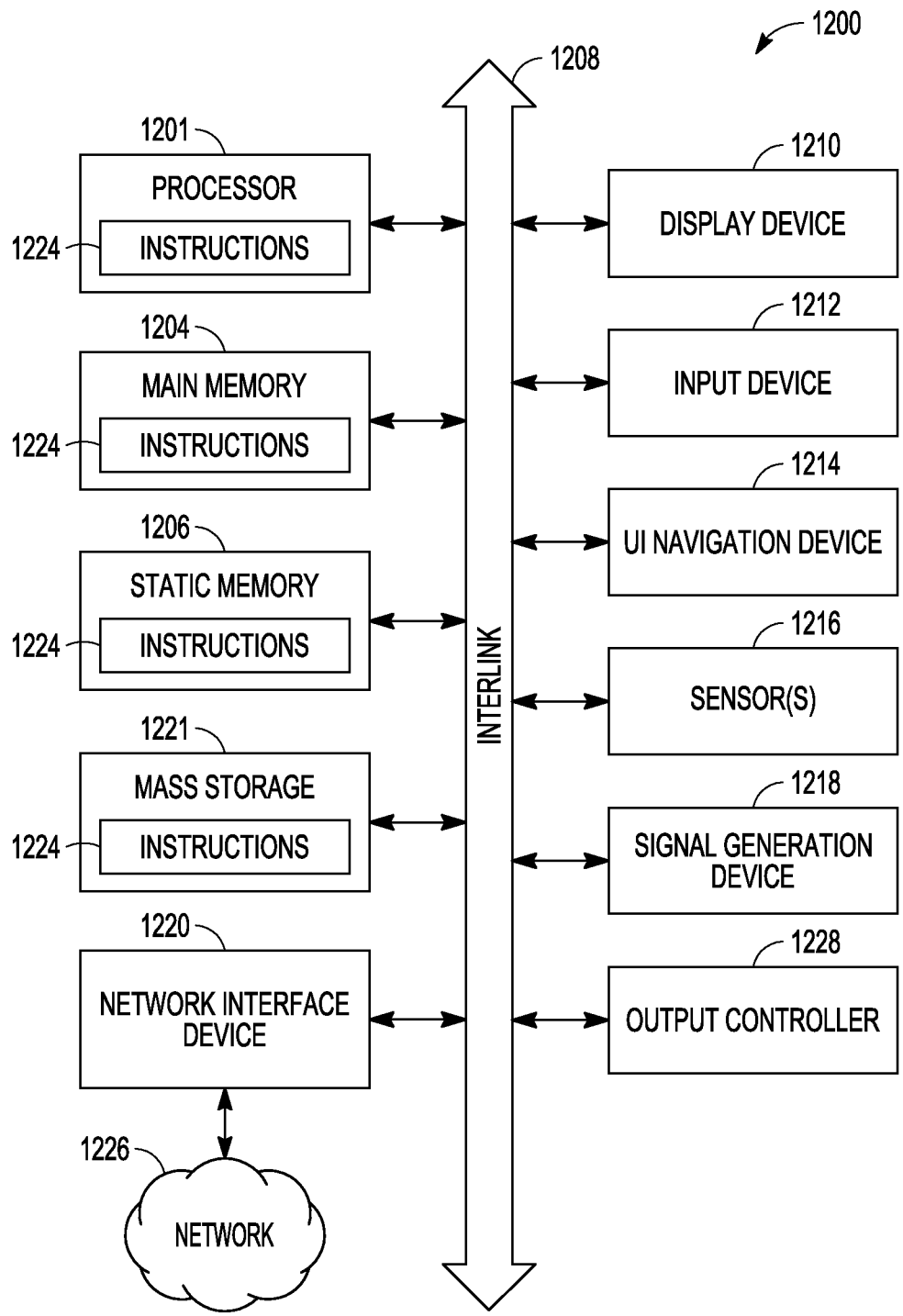
FIG. 12 illustrates a block diagram of an example machine including one or more devices having PMOS and NMOS structures, according to various embodiments.

FIG. 12 illustrates a block diagram of an example machine 1200 having one or more embodiments of devices having PMOS and NMOS structures as discussed herein. In alternative embodiments, machine 1200 can operate as a standalone device or can be connected (e.g., networked) to other machines. In a networked deployment, machine 1200 can operate in the capacity of a server machine, a client machine, or both in server-client network environments. In an example, machine 1200 can act as a peer machine in peer-to-peer (P2P) (or other distributed) network environment. Machine 1200 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. The instructions enable participating hardware (e.g., the execution units or a loading mechanism) to create members of the circuitry in hardware via the variable connections to carry out portions of the specific tasks when in operation. Accordingly, the computer readable medium can be communicatively coupled to the other components of the circuitry when the device is operating. In an example, any of the physical components can be used in more than one member of more than one circuitry.

Machine (e.g., computer system) 1200 can include a hardware processor 1201 (e.g., a CPU, a GPU, a hardware processor core, or any combination thereof), a main memory 1204 and a static memory 1206, some or all of which can communicate with each other via an interlink (e.g., bus) 1208. Machine 1200 can further include a display unit 1210, an alphanumeric input device 1212 (e.g., a keyboard), and a user interface (UI) navigation device 1214 (e.g., a mouse). In an example, display unit 1210, input device 1212, and UI navigation device 1214 can be a touch screen display. Machine 1200 can additionally include a mass storage (e.g., drive unit) 1221, a signal generation device 1218 (e.g., a speaker), a network interface device 1220, and one or more sensors 1216, such as a global positioning system (GPS) sensor, compass, accelerometer, or other sensor. Machine 1200 can include an output controller 1228, such as a serial (e.g., USB, parallel, or other wired or wireless (e.g., infrared (IR), near field communication (NFC), etc.) connection to communicate or control one or more peripheral devices (e.g., a printer, card reader, etc.).

Machine 1200 can include a machine readable medium on which is stored one or more sets of data structures or instructions 1224 (e.g., software) embodying or utilized by machine 1200. Instructions 1224 can also reside, completely or at least partially, within main memory 1204, within static memory 1206, within mass storage 1221, or within hardware processor 1201 during execution thereof by machine 1200. In an example, one or any combination of hardware processor 1201, main memory 1204, static memory 1206, or mass storage 1221 can constitute the machine readable medium. While the machine readable medium can be a single medium or multiple media (e.g., a centralized or distributed database, or associated caches and servers) configured to store one or more instructions 1224.

The term "machine readable medium" can include any medium that is capable of storing instructions for execution by machine 1200 and that cause machine 1200 to perform any one or more of the techniques for which machine 1200 is implemented. Non-limiting machine readable medium examples can include solid-state memories, and optical and magnetic media. Non-volatile machine readable medium can include semiconductor memory devices such as EPROM, EEPROM, and flash memory devices; magnetic disks, such as internal hard disks and removable disks; magneto-optical disks; and compact disc-ROM (CD-ROM) and digital versatile disc-read only memory (DVD-ROM)

disks. Volatile machine readable medium can include (RAM), DRAM, SRAM, or SDRAM.

Instructions 1224 (e.g., software, programs, an operating system (OS), etc.) or other data stored on mass storage 1221, can be accessed by memory 1204 for use by processor 1201. Memory 1204 (e.g., DRAM) is typically fast, but volatile, and thus a different type of storage than mass storage 1221 (e.g., an SSD), which is suitable for long-term storage, including while in an "off" condition. Instructions 1224 or data in use by a user or machine 1200 are typically loaded in memory 1204 for use by processor 1201. When memory 1204 is full, virtual space from mass storage 1221 can be allocated to supplement memory 1204; however, because mass storage 1221 is typically slower than memory 1204, and write speeds are typically at least twice as slow as read speeds, use of virtual memory can greatly reduce user experience due to storage device latency (in contrast to memory 1204, e.g., DRAM). Further, use of mass storage 1221 for virtual memory can greatly reduce the usable lifespan of mass storage 1221.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

Instructions 1224 can further be transmitted or received over a communications network 1226 using a transmission medium via network interface device 1220 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, network interface device 1220 can include one or more physical jacks (e.g., Ethernet, coaxial, or phone jacks) or one or more antennas to connect to the communications network 1226. In an example, network interface device 1220 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of transporting instructions for execution by machine 1200, and includes digital or analog communications signals or other tangible medium to facilitate communication of such instructions or data associated with the instructions.

The following example embodiments of methods and devices, in accordance with the teachings herein.

An example method 1 can comprise forming a p-channel metal-oxide-semiconductor (PMOS) structure and a n-channel metal-oxide-semiconductor (NMOS) structure, the PMOS structure formed with a stressor source/drain region to a channel region of the PMOS structure; forming a first metal silicide to the NMOS structure in an active area of the NMOS structure; and forming a second metal silicide to the stressor source/drain region after forming the first metal silicide to the NMOS structure.

An example method 2 can include features of example method 1 and can include forming material of the second metal silicide on and contacting the first metal silicide to the NMOS structure.

An example method 3 can include features of example method 2 and features of any of the preceding example methods and can include forming material of the second metal silicide on and contacting the first metal silicide while forming the second metal silicide.

An example method 4 can include features of any of the preceding example methods and can include forming an embedded silicon germanium region as the stressor source/drain region.

An example method 5 can include features of example method 4 and features of any of the preceding example methods and can include forming the first metal silicide to include performing a salicide formation of the NMOS structure with cobalt or nickel.

An example method 6 can include features of any of the preceding example methods and can include forming the second metal silicide to include forming titanium silicide contacting the stressor source/drain region.

An example method 7 can include features of example method 6 and features of any of the preceding example methods and can include forming titanium contacting the first metal silicide with the first metal silicide formed as a cobalt silicide or a nickel silicide.

In an example method 8, any of the example methods 1 to 7 can be performed to structure an electronic memory apparatus further comprising a host processor and a communication bus extending between the host processor and a memory device.

In an example method 9, any of the example methods 1 to 8 can be modified to include operations set forth in any other of method examples 1 to 8.

In an example method 10, any of the example methods 1 to 9 can be implemented at least in part through use of instructions stored as a physical state in one or more machine-readable storage devices.

An example method 11 can include features of any of the preceding example methods 1 to 10 and can include performing functions associated with any features of example electronic devices 1 to 9.

An example method 12 can comprise forming a p-channel metal-oxide-semiconductor (PMOS) structure having a first gate stack on a silicon surface of a substrate and a n-channel metal-oxide-semiconductor (NMOS) structure having a second gate stack on the silicon substrate, the PMOS structure formed with a stressor source/drain region to a channel region of the PMOS structure; forming a protective mask on the PMOS structure; reacting a metal on the silicon surface in an active area for the NMOS, forming a metal silicide contact for the NMOS structure, while maintaining the mask on the PMOS structure; forming a dielectric covering the PMOS structure and the NMOS structure; forming openings through the dielectric to the stressor source/drain region and the metal silicide; and forming contact metals in the openings to the stressor source/drain region and to the metal silicide.

An example method 13 can include features of example method 12 and can include the stressor source/drain region to include embedded silicon germanium.

An example method 14 can include features of any of the preceding example methods 12-13 and can include reacting the metal to include reacting cobalt or nickel on the silicon surface.

An example method 15 can include features of any of the preceding example methods 12-14 and can include forming the protective mask on the NMOS structure when forming the protective mask on the PMOS structure; and removing the protective mask from the NMOS structure before reacting the metal on the silicon surface.

An example method 16 can include features of any of the preceding example methods 12-15 and can include forming the contact metals in the openings to include forming one or more of the contact metals after forming a metal silicide contacting the stressor source/drain region.

An example method 17 can include features of example method 16 and features of any of the preceding example methods 12-15 and can include forming the metal silicide contacting the stressor source/drain region to include forming titanium silicide contacting the stressor source/drain region.

An example method 18 can include features of any of the preceding example methods 12-17 and can include forming the contact metals in the openings to include filling the openings with the contact metals followed by annealing.

An example method 19 can include features of any of the preceding example methods 12-18 and can include forming the contact metals in the openings to include filling the openings with titanium, titanium nitride, or tungsten.

In an example method 20, any of the example methods 12 to 19 can be performed to structure an electronic memory apparatus further comprising a host processor and a communication bus extending between the host processor and the memory device.

In an example method 21, any of the example methods 12 to 20 can be modified to include operations set forth in any other of method examples 12 to 20.

In an example method 22, any of the example methods 12 to 21 can be modified to include operations set forth in any other of method examples 1 to 11.

In an example method 23, any of the example methods 12 to 22 can be implemented at least in part through use of instructions stored as a physical state in one or more machine-readable storage devices.

An example method 24 can include features of any of the preceding example methods 12 to 23 and can include performing functions associated with any features of example memory devices 1 to 9.

An example memory device 1 can comprise: a p-channel metal-oxide-semiconductor (PMOS) transistor having a first gate stack and a stressor source/drain region to a channel region of the PMOS transistor; a n-channel metal-oxide-semiconductor (NMOS) transistor having a second gate stack; a first metal silicide in a vertically lowest portion of a contact in an active area of the NMOS transistor, the first metal silicide including a first metal element; and a second metal silicide contacting the stressor source/drain region, the second metal silicide structured without containing the first metal element.

An example electronic device 2 can include features of example electronic device 1 and can include a second metal element of the second metal silicide on and contacting the first metal silicide.

An example electronic device 3 can include features of example electronic device 2 and features of any of the preceding example electronic devices and can include the second metal element being titanium.

An example electronic device 4 can include features of any of the preceding example electronic devices and can include the first metal element to include one of nickel, cobalt, or platinum.

An example electronic device 5 can include features of any of the preceding example electronic devices and can include the stressor source/drain region to include embedded silicon germanium.

In an example electronic device 6, any of the electronic devices of example electronic devices 1 to 5 can include electronic devices incorporated into an electronic memory apparatus further comprising a host processor and a communication bus extending between the host processor and the electronic device.

In an example electronic device 7, any of the electronic devices of example electronic devices 1 to 6 can be modified to include any structure presented in another of example electronic device 1 to 6.

In an example electronic device 8, any apparatus associated with the electronic devices of example electronic devices 1 to 7 can further include a machine-readable storage device configured to store instructions as a physical state, wherein the instructions can be used to perform one or more operations of the apparatus.

In an example electronic device 9, any of the electronic devices of example electronic devices 1 to 8 can be structured in accordance with any of the methods of the above example methods 1 to 24.

An example machine-readable storage device 1 storing instructions, that when executed by one or more processors, cause a machine to perform operations, can comprise instructions to perform functions associated with any features of example electronic devices 1 to 9 or perform methods associated with any features of example methods 1 to 24.

Although specific embodiments have been illustrated and described herein, it will be appreciated by those of ordinary skill in the art that any arrangement that is calculated to achieve the same purpose can be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method comprising:
  forming a p-channel metal-oxide-semiconductor (PMOS) structure and a n-channel metal-oxide-semiconductor (NMOS) structure, the PMOS structure formed with a stressor source/drain region to a channel region of the PMOS structure;
  forming a first metal silicide to the NMOS structure in an active area of the NMOS structure; and
  after forming the first metal silicide to the NMOS structure, forming a second metal silicide to the stressor source/drain region by forming a metal contact on and contacting the stressor source/drain while concurrently forming a metal contact on and contacting the first metal silicide.

2. The method of claim 1, wherein the method includes forming a common material structure for the second metal silicide and a portion of the metal contact to the first metal silicide on and contacting the first metal silicide.

3. The method of claim 2, wherein forming the common material structure includes forming titanium silicide.

4. The method of claim 1, wherein the method includes forming an embedded silicon germanium region as the stressor source/drain region.

5. The method of claim 1, wherein forming the first metal silicide includes performing a salicide formation of the NMOS structure with cobalt or nickel.

6. The method of claim 1, wherein forming the second metal silicide includes forming titanium silicide contacting the stressor source/drain region.

7. The method of claim 6, wherein the method includes forming titanium contacting the first metal silicide with the first metal silicide formed as a cobalt silicide or a nickel silicide.

8. A method comprising:
forming a p-channel metal-oxide-semiconductor (PMOS) structure having a first gate stack on a silicon surface of a substrate and a n-channel metal-oxide-semiconductor (NMOS) structure having a second gate stack on the silicon substrate, the PMOS structure formed with a stressor source/drain region to a channel region of the PMOS structure;
forming a protective mask on the PMOS structure;
reacting a metal on the silicon surface in an active area for the NMOS structure, forming a metal silicide contact in the active area for the NMOS structure, while maintaining the mask on the PMOS structure;
forming a dielectric covering the PMOS structure and the NMOS structure;
forming openings through the dielectric to the stressor source/drain region and to the metal silicide contact in the active area for the NMOS structure; and
forming contact metals in the openings to the stressor source/drain region and to the metal silicide contact such that a metal silicide contact region is formed on and contacting the metal silicide contact in the active area for the NMOS structure and concurrently a first metal silicide is formed on and contacting the stressor source/drain region of the PMOS structure.

9. The method of claim 8, wherein the stressor source/drain region includes embedded silicon germanium.

10. The method of claim 8, wherein reacting the metal includes reacting cobalt or nickel on the silicon surface.

11. The method of claim 8, wherein the method includes:
forming the protective mask on the NMOS structure when forming the protective mask on the PMOS structure; and
removing the protective mask from the NMOS structure before reacting the metal on the silicon surface.

12. The method of claim 8, wherein forming the contact metals in the openings includes forming one or more of the contact metals after forming the first metal silicide contacting the stressor source/drain region.

13. The method of claim 12, wherein forming the first metal silicide contacting the stressor source/drain region includes forming titanium silicide contacting the stressor source/drain region.

14. The method of claim 8, wherein forming the contact metals in the openings includes filling the openings with the contact metals followed by annealing.

15. The method of claim 8, wherein forming the contact metals in the openings includes filling the openings with titanium, titanium nitride, or tungsten.

* * * * *